United States Patent
Westphal et al.

[11] Patent Number: 5,431,164
[45] Date of Patent: Jul. 11, 1995

[54] THERAPY TOMOGRAPH

[75] Inventors: Michael Westphal, Offenbach; Gënther Laukien, Rheinstetten, both of Germany

[73] Assignee: Bruker Analytische Messtechnik GmbH, Rheinstetten, Germany

[21] Appl. No.: 257,738

[22] Filed: Jun. 9, 1994

[30] Foreign Application Priority Data

Jul. 17, 1993 [DE] Germany .................. 43 24 021.6

[51] Int. Cl.⁶ ............................................. A61B 5/055
[52] U.S. Cl. .................. 128/653.2; 324/307; 324/318
[58] Field of Search .......... 128/653.2, 653.5; 324/318, 321, 322, 307

[56] References Cited

U.S. PATENT DOCUMENTS

| | | | |
|---|---|---|---|
| 4,716,370 | 12/1987 | Inoue et al. | 324/318 |
| 4,728,896 | 3/1988 | Bendall et al. | 324/309 |
| 4,733,190 | 3/1988 | Dembinski | 324/318 |
| 4,817,612 | 4/1989 | Akins et al. | 324/318 |
| 4,829,252 | 5/1989 | Kaufman | 324/309 |
| 4,862,086 | 8/1989 | Maeda | 324/318 |
| 4,875,485 | 10/1989 | Matsutani | 324/307 |
| 4,985,678 | 1/1991 | Gangarosa et al. | 128/653.2 |
| 5,109,198 | 4/1992 | Murakami et al. | 324/318 |

FOREIGN PATENT DOCUMENTS

| | | |
|---|---|---|
| 0350267 | 1/1990 | European Pat. Off. . |
| 0430103 | 6/1991 | European Pat. Off. . |
| 3907927 | 9/1990 | Germany . |
| 4029477 | 4/1991 | Germany . |

*Primary Examiner*—Lee S. Cohen
*Assistant Examiner*—Brian L. Casler
*Attorney, Agent, or Firm*—Bookstein & Kudirka

[57] ABSTRACT

In an NMR tomography apparatus with a superconducting main-field coil comprising two partial coil systems which are rotationally symmetric about a horizontal central z axis and are arranged mirror-symmetrically with respect to a vertical transverse middle plane $E_q$ and which are accommodated within a two-part cryostat which is symmetric with respect to the transverse middle plane $E_q$ and which comprises two slice-like partial cryostats which are connected to each other through strut-like connecting elements (8) of length g running largely parallel to the central axis z to form the entire cryostat and which exhibit a room temperature bore of diameter $d_B$ running symmetrically about the central z axis, whereby $1.6\ g \leq d_B\ 2.1\ g$, precisely three vertical connecting elements (8) are provided for which are arranged asymmetrically with respect to a vertical longitudinal middle plane $E_l$ and assume angular positions in the ranges 50° to 100°, 180° to 230° an 320° to 10°, whereby the angular difference of the positions of two neighboring connecting elements (8) is not larger than 180°. In this fashion, the transverse access to the patient bore of the configuration can be utilized by a therapist for the treatment of patients during the operation of the tomography apparatus without encroaching upon the mechanical stability of the cryostat.

17 Claims, 7 Drawing Sheets

THERAPY TOMOGRAPH

BACKGROUND OF THE INVENTION

The invention concerns a nuclear magnetic resonance (NMR) tomography apparatus with a superconducting main-field magnet made from two partial coil systems which are rotationally symmetric about a horizontal central axis z and which produce a homogeneous static magnetic field, the partial coils being mirror-symmetrically arranged with respect to a vertical transverse middle plane $E_q$ which runs at right angles to the central axis z, and with a system of grading coils, whereby at least the partial coil system of the superconducting main-field coil is accommodated within a two-part cryostat which is symmetric with respect to the transverse middle plane $E_q$ and Which comprises two slice-like partial cryostat which are connected by means of strut-like connecting elements, running largely parallel to the central axis z of length g, into a complete cryostat and which exhibits a cylindrical room temperature bore having a diameter $d_B$ and running parallel to the central axis z.

An NMR tomography apparatus of this kind is, for example, known in the art from DE 39 07 927 A1.

Although, in the past, tomography systems have been practically exclusively used for diagnosis, the future will see an ever increasing need for combined systems with which therapeutic measures can be directly followed and checked using tomography apparatuses. A large number of therapeutic measures, for example, invasive surgery, in particular micro-surgery or radiation treatments necessitate as free an access to the patient as possible. This is, however, hindered in conventional NMR systems by all three field-producing components, namely the main-field magnet, the gradient magnet system, as well as the RF resonator.

The problem with respect to the main-field magnet has already been solved with the magnet system which has become known through DE 39 07 927 A1 comprising a transverse field magnet with a Helmholtz-like coil which, because of its construction, only slightly limits the free sideward access to the measurement volume.

The problem of as uninhibited a side access through the RF resonator as possible has been solved by the subsequent laid-open application DE 42 30 140 A1 of the same applicant having the title "YIN-YANG-RF-coil" with the assistance of the asymmetric saddle coils described therein, whereby the important tomographic property of a sufficiently high homogeneity for the produced RF field is fulfilled.

In order to facilitate the carrying out of minimally invasive procedures (so-called keyhole surgery) with which, due to the lack of a direct field of view onto the operation region caused by the, under certain circumstances, extremely small operation opening in the patient, NMR monitoring provides the operator with an important assistance for the on-line observation of the operation, the transverse access to the measurement volume within the NMR apparatus has as large a sideward access angle as possible, and should not be limited by the gradient coil system. This problem has been solved by the subsequently published DE 42 30 145 A1 "Gradient coils for Therapy Tomographs" which also stems from the same applicant.

In the above-mentioned superconducting main-field magnet of DE 39 07 927 A1 having good transverse access possibilities, the axially outer partial coils exhibit an outer diameter of approximately 2 m. It is possible to produce homogeneous magnetic fields in a spherically-shaped investigational volume having a diameter of about 0.4 m using such a magnet system with a maximum relative field strength fluctuation of 10 ppm. If magnet coils are cooled with liquid helium and comprise commercial superconducting wire based on niobium titanium alloys, it is possible to produce field strengths of 0.5 T and above. Due to the Lorentz forces, the partial coils lying on both sides of the transverse access opening pull towards each other with a total force of over 300,000N. This force must be captured by support construction towards which end strut-like connecting elements are provided for in the known main-field magnet system which connect the two slice-like partial cryostats and which facilitate an exchange of cryogenic liquids between these parts.

These connecting elements of the outer container of the cryostat or the parts enclosing same necessarily pass through the transverse access region and, in principle, limit its unrestricted use.

The horizontal configuration of the magnet system facilitates the bringing of a patient on a patient bed into the axial bore of the system, whereby the transverse access opening allows, in principle, for the possibility of carrying out therapeutic measures on the patient and of monitoring their progress with NMR investigations. A particularly large degree of freedom in carrying out such therapeutic measures would allow, if possible, for a first person (for example a therapist) to stand erect during the NMR investigation in the vicinity of the transverse access opening next to the patient and, if necessary, to bend down over the patient. In addition it would be quite helpful if, in addition, a second person (for example an assistant) could likewise stand erect on the other side next to the patient and, for example, provide manual assistance. The possibilities towards this end are, however, in principle rendered more difficult by the fact that the partial coils located on both sides of the transverse access openings attract each other with a large force and must necessarily be supported with respect to each other.

Towards this end it is necessary that the support body, which supports all partial coils of the main-field magnet be a single integrated mechanical unit which is embodied in the vicinity of the transverse access openings by the strut-like connecting elements. In order for the construction to be mechanically secure, these connecting elements should be loaded, when accepting the Lorentz forces, solely under compression and in no event under tension. It is, however, thereby necessary for these connecting elements as well as the essentially tube-shaped radiation shields and pressure-vessel portions of the cryostat which surround them to be located in the vicinity of the transverse openings and to thereby limit the freedom of motion of the therapist or therapists.

In contrast thereto it is the purpose of the present invention to present an NMR tomography apparatus of the above-mentioned kind wherein, on the one hand, the cryostat for the superconducting main-field magnet is constructed in a mechanically stable fashion and wherein, with the occurrence of Lorentz forces, its individual components are solely subjected to compressional loads, whereby, however, the construction facilitates an optimal transverse access and free space for the activities of, for example, a therapist or an assistant working on a patient lying in the investigational volume of the tomography apparatus.

SUMMARY OF THE INVENTION

This purpose is achieved in accordance with the invention in that precisely three strut-like connecting elements are provided for which are arranged asymmetrically with respect to a vertically running longitudinal middle plane $E_1$ containing the central z axis, whereby the points of intersection (+) of the lines of centers of gravity of the connecting elements, parallel to the central z axis, through the vertical transverse middle plane $E_q$ relative to the points of intersection of the central axis z as calculated in a counter-clockwise sense with respect to the vertical line of intersection of the longitudinal middle plane $E_m$ with the transverse middle plane $E_q$ assume angular positions, directed perpendicularly downward from the point of intersection of the central axis z in the ranges of 50° to 100°, 180° to 230° and 320° to 10°, and whereby the difference of the angular positions of two neighboring intersection points (+) is not larger than 180°.

The inventive spatial distribution of three strut-like connecting elements guarantees that, on the one hand, no imbalanced loading, in particular, no tensile loading of the oppositely lying slice-like partial cryostats takes place when Lorentz forces occur during field operation, and on the other hand that only an absolute minimum of "obstruction" is built in the working area of the therapist. With this configuration it is possible for the therapist to stand directly adjacent to the patient lying in the room temperature bore of the cryostat configuration within the strut-like connecting elements, by way of example at a work console, and treat the patient, whereby he simultaneously observes the therapeutic results on a monitor to which the simultaneously recorded NMR image of the patient is transmitted. Furthermore, an assistant standing outside of the connecting elements can provide manual assistance through a sufficiently large transverse opening, whereby the visual contact between the therapist and the assistant is not lost when both people are standing erect.

In a preferred embodiment of the inventive NMR tomography apparatus the difference of angular positions between neighboring points of intersection of the lines of centers of gravity of the connecting elements through the vertical transverse middle plane $E_q$ is not more than 140°. Thereby, on the one hand, a maximum stability is guaranteed and, on the other hand, the desired freedom of motion for the therapist and his assistant is not essentially limited.

In another embodiment the difference between the angular positions of two neighboring connecting elements is approximately 120° in each case. With this distribution of connecting elements each individual connecting element takes up an equal approximate one third of the total compressional forces which occur.

From an ergonomic point of view, in particular with respect to the optimal working position and working posture of the therapist as well as his assistant, an embodiment of the inventive NMR tomography apparatus is particularly advantageous with which the connecting elements assume angular positions in the ranges 65° through 85°, 195° through 215° and 335° through 355°.

Preferentially, one has for the gap g between the two partial cryostats relative to the diameter $d_B$ of the room temperature bore: $1.6 \text{ g} \leq d_B 2.1$.

In a particularly preferred embodiment of the inventive NMR tomography apparatus, a system of gradient coils is provided for comprising at least four largely equal saddle-type partial coils which are arranged symmetrically at radial and axial separations with respect to a coordinate origin defined by the point of intersection of the central axis z with the line of intersection of the transverse middle plane $E_q$ with the longitudinal middle plane $E_1$ and which each exhibit two electrically conducting segments which run in the azimuthal direction about the z axis of which one segment has as small a radial separation $r_1$ as possible and the other segment as a large a radial separation $r_2$ as possible from the z axis and each partial coil exhibits a plurality of windings and both azimuthal segments exhibit an axial separation from each other in the direction of the z axis, whereby the radially outer segment with the radial separation $r_2$ from the z axis is arranged, axially relative to the z axis, more closely to the coordinate origin than the radially inner segment with the radial separation $r_1$ from the z axis and whereby both segments are connected to each other by means of connecting sections and are commonly located on a rotationally symmetric or ellipsoidal surface r (z).

With a configuration of this kind, as shown in detail in subsequently published DE 42 30 145 A1, a tesseral gradient field is produced whose linearity within the measurement volume is comparable to the tesseral gradient fields produced by the classic saddle coils or the streamline-shaped coils, whereby the sideward access to the measurement volume through the inventive gradient coil system is not hindered and one has the additional advantage that an extremely small parasitic portion of radial field components of the produced gradient fields is present outside of the measurement volume. Due to the configuration of all the conductive elements, for example, of an x gradient coil in a rotationally symmetric surface $r_x$ (z), all partial coils of this gradient coil can be mounted, for example, on the surface of a closely adjacent mounting surface $r_{x1}$ (z). The surface of all parts of the finally mounted x gradient coil then also comprise a similar and closely adjacent surface upon which the partial coils of the y gradient coils—each displaced by 90° with respect to the corresponding partial coils of the x gradient coil—can be mounted and attached. On the basis of field calculations it is possible to show that the inventive coil system leads to a quite satisfactory imaging performance.

The inventive coils should also, for reasons of linearity, exhibit an azimuthal extent of approximately 120°. However, the x and y gradient coils do not interfere with each other if all elements of, for example the x coil, are located in a rotationally symmetric surface $r_x$ (z) which is easily achieved with the inventive configuration. The x coil can also be mounted and the surface of this coil can then likewise constitute a nearly identical rotationally symmetric surface r (z) upon which the elements of the y coil—displaced by 90° with respect to the elements of the x coil—can be mounted.

In an additional embodiment the axial separation $g_g$ of two partial coils, lying mirror-symmetrically across from each other with respect to the xy plane, in the z direction is approximately equal to the gap g. In this fashion, on the one hand, the width of the gap is not limited any further, and on the other hand, the gradient strength per unit current as well as the linearity of the gradient field remains maximized.

In an additional preferred embodiment twice the radial separation $2 \cdot r_2$ of the azimuthal segments lying most closely adjacent to the gap is only slightly smaller than the diameter $d_B$ of the room temperature bore of the cryostat or the main-field magnet. In this fashion, the space in the axial bore of the main-field magnet is optimally utilized and, in particular, the gradient strength per unit current as well as the linearity of the gradient field is maximized.

In a further preferred embodiment the value of the radial separation $2 \cdot r_1$ of the azimuthal segment lying most closely to the axis is only slightly larger than the diameter of a hypothetical cylinder which allows for a sufficient amount of space for the patient during the investigation.

In a further embodiment a compensation coil is provided for each partial coil which exhibits, in the axial region of the radially inner segment of the partial coil, an azimuthal inner segment with a radial separation $r'_1$ from the z axis which is slightly different than the radial separation $r_1$ of the radially inner segment of the partial coil, preferentially approximately by the radial thickness of the segment. A compensation coil of this kind can at least partially compensate for the angular momentum which takes place when current flows through the partial coils.

In a particularly advantageous improvement the compensation coil exhibits a second azimuthal segment which is, in the z direction, axially further away from the coordinate origin than the first azimuthal segment of the compensation coil and which has a radial separation $r'_2 > r'_1$ from the z axis. A compensation coil of this kind represents a second "cropped" saddle coil, which, when current is flowing through it, generates together with the partial coil a total field whose radial field magnitude in the vicinity of the main-field magnet coil and the cryostat which usually surrounds same is vanishingly small. In this fashion, only a small degree of eddy currents, which could encroach upon the homogeneity of the magnetic field produced by the main coil in the measuring volume, are excited in the metal structures.

An embodiment is particularly preferred in which shielding coils are provided for arranged around each of two partial coils with which are axially opposite each other with respect to the z axis on the surface of a cylinder about the z axis having a radius $R_2 \geq r_2$ and an axial extension in the z direction which corresponds approximately to the axial extension of the main-field magnets excluding the gap. By means of a shielding coil of this kind it is possible, with the inventive coil shape, to further suppress the already small radial field components of the gradient field in the vicinity of the main-field magnet which could cause the fundamentally interfering eddy currents.

The windings of such a shielding coil are preferentially connected in series with the windings of the corresponding gradient coil.

Since the gradient coil, in and of itself, already produces only small radial field contributions in the vicinity of the main-field magnet, the number of windings of such a shielding coil is smaller than the number of the windings of the corresponding gradient coil. Methods for calculating the optimal geometric dependence of the windings of such shielding coils can be derived from methods given for the case of conventional gradient coils arranged on a single cylindrical surface which are, for example, given in the publication EP-A 0 216 590.

The coils could comprise windings from wire, preferentially copper wire, or could be at least partially made from a closed band preferentially made from copper sheet metal, the so-called "stream-line coils". This type of stream-line coils is known per se from the publication EP-A 0 320 285 and exhibits the advantages described therein.

An embodiment of the inventive NMR tomography apparatus which is particularly preferred provides for two sets of x or y gradient coils which are each displaced by 90° about the z axis with respect to another and which each comprise four partial coils. In this fashion, the advantage of the configuration of partial coils having a relatively small azimuthal circumference about the z axis of less than 90° is appropriately taken advantage of.

In order to be able to produce gradient fields in every spatial direction, a preferred embodiment provides for a shielded z gradient coil system to excite magnetic gradient fields with an essentially linear dependence in the measuring volume in a direction parallel to the z axis which comprises two cylindrical winding pairs arranged mirror-symmetrically with respect to the xy plane about the z axis with each having a radially inner z gradient field winding and a radially outer shielding coil winding. In order to optimally utilize, with the gradient coils, the free space remaining between the radially outer segments and the patient bore the toroidal winding pairs are arranged in the axial region of the azimuthal segments, whereby the radial separation $r_4$ of the shielding coil windings is less than the radial separation $r_2$ of the radially outer segment.

The z gradient field winding, in a preferred embodiment, exhibits approximately $(r_4/r_3)^2$ times the amount of windings than the oppositely shielding coil winding which surrounds it, whereby $r_3$ is the radial separation of the z gradient winding from the z axis. In this fashion, it is possible to greatly reduce the fringe field in the vicinity of the cryostat. In general, the winding numbers of the shielding coil winding can be optimized in such a fashion that the fringe field in the vicinity of the cryostat is minimized. In contrast to an "ideal" shield the windings of the shielding coil windings are not distributed rather arranged in a concentrated fashion. In this manner, the eddy current interferences are nevertheless significantly smaller than with a coil which is not actively shielded.

Both the gradient coils as well as the compensation, shielding, and cylindrical coils are typically potted within a carrying body in plastic in such a fashion that an axial bore about the z axis remains open which is suitable for the acceptance of a person within the tomography system.

With the inventive NMR tomography apparatus, it is possible to provide for a radial frequency (RF) coil system which is either axially insertable into the axial bore of the support body or transversely insertable into the gap g of the main-field magnet, which produces a largely homogeneous RF field in the measurement volume in the direction of the x or the y axis.

An embodiment is particularly preferred with which the RF coil system comprises a closed saddle-shaped RF coil which is arranged about the z axis symmetric to the zy plane and to the xy plane, however, asymmetric with respect to the zx plane.

Such a so-called "YIN-YANG coil" allows, on the one hand, for the production of sufficiently homogeneous RF fields perpendicular to the z axis and, on the other hand, does not hinder the sideward access to the measurement volume.

In a preferred embodiment the RF coil exhibits four extremum points $P_1$ to $P_4$ in the direction of the y axis with the approximate, preferentially exact, coordinates

| | | | |
|---|---|---|---|
| $P_1$: | $x_1 = 0$ | $y_1 = +a$ | $z_1 = +a$ |
| $P_2$: | $x_2 = 0$ | $y_2 = +a$ | $z_2 = -a$ |
| $P_3$: | $x_3 = -a$ | $y_3 = -a$ | $z_3 = 0$ |
| $P_4$: | $x_4 = +a$ | $y_4 = -a$ | $z_4 = 0$ | whereby a, in each case, designates the same particular path length.

The path length a can be between 20 to 50 cm, preferentially approximately 30 cm.

In order to fully utilize the advantages of an increased transparency with respect to a sideward engagement or an accessability diagonally from above in the direction towards the measuring volume as is achieved by the inventive configuration of the gradient coil system, it is advisable to utilize a main-field coil system in accordance with the above-mentioned publication DE 39 07 927 A1 with a Helmholtz-like construction of the transverse field coil. The characteristics and advantages of a main-field coil of this type are discussed in detail in the mentioned publication the contents of which are hereby incorporated by reference so that a further repetition of these features at this point is obviated.

The invention is more closely described and explained below with regard to the embodiments represented in the drawing. The features which can be derived from the description and the drawing can be utilized in other embodiments of the invention individually or collectively in arbitrary combination.

DESCRIPTION OF THE PREFERRED EMBODIMENT

Figure 1A:
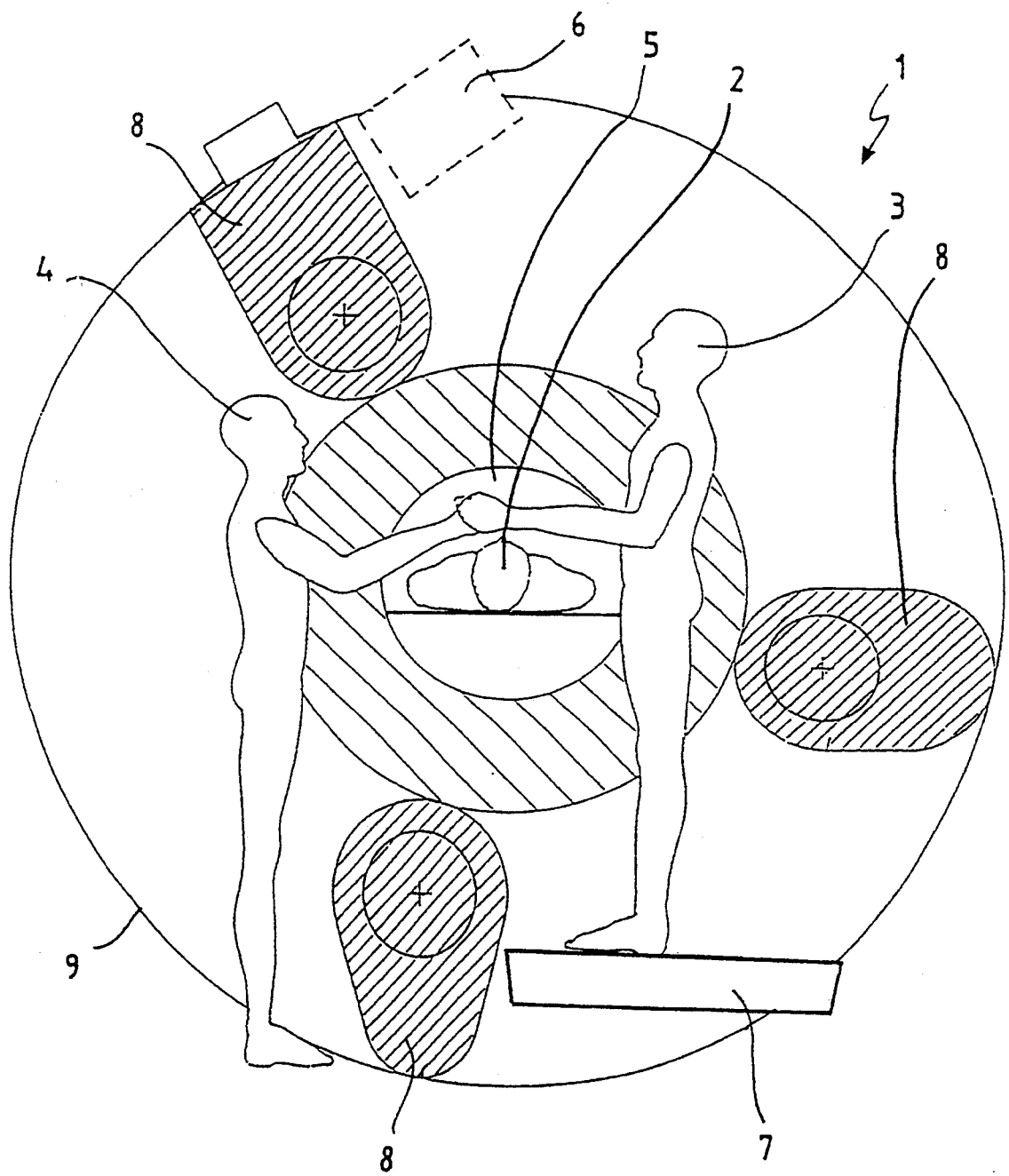
FIG. 1a shows a schematic cut through the transverse middle plane $E_q$ of the inventive tomography apparatus with a therapeutic cryomagnet as well as a patient, a therapist and an assistant.

With the inventive NMR tomography apparatus 1 of FIG. 1 having a superconducting main-field coil which is not shown and which comprises two partial coil systems which are rotationally symmetrically arranged about the horizontal central axis z, the two slice-like partial cryostats of the cryostat 9 in which the superconducting main-field coil is located, are connected by means of strut-like connecting elements 8 running perpendicular to the plane of the drawing to form a complete cryostat. As indicated, a patient 2 lies within a cylindrical room temperature bore 5 which runs symmetrically about the central axis z of the system, adjacent to whom a therapist 3 stands at a work console 7 and is supported by an assistant 4 providing manual assistance. The therapist 3, by means of monitor 6, can check the consequences of his treatment during the course of the treatment with the assistance of NMR images of the patient 2 represented on the monitor 6.

With the inventive configuration of the connecting elements 8, the therapist 3 can operate in an ergonomically advantageous posture while facing the patient 2 and standing erect. Towards this end, the connecting element 8 which is most proximate to his head is located circa 45 cm from the head and is therefore, from a visual point of view, not located uncomfortably close and facilitates a completely undisturbed bending over of the therapist 3 towards the patient 2 with his upper body. The monitor is positioned directly above the connecting elements 8 and can be easily observed by the therapist from this position by intermittently straightening-up. Since the magnet configuration produces a torus-shaped free region in the vicinity of the gap between the connecting element 8 at a separation of circa 1.25 m from the central axis z, it is possible to utilize a conventional monitor within the only weakly-loaded iron shielding despite a certain sensitivity of such monitors with respect to magnetic fields. Instead of "conventional" monitors which function with cathode ray tubes, a class of monitors which are less sensitive to magnetic fields based on LCD technology can be utilized. In order for the configuration of the connecting elements 8 to guarantee a mechanically stable acceptance of the Lorentz forces generated during operation of the magnetic field, these forces effecting a mutual attraction between the two slice-like partial cryostats with total forces in the vicinity of 300,000N to 400,000N, the centers of gravity of the connecting elements 8, indicated with (+), should be located relative to the central axis z shown in FIG. 1b at angular positions in the ranges of 50° to 100°, 180° to 230° and 320° to 10° In particular, the difference between the angular position of two neighboring points of intersection (+) of connecting elements 8 with the plane of the drawing which, in the embodiment shown, also defines the transverse middle plane $E_q$ of the configuration, cannot be larger than 180°.

An optimal equal distribution of the compressive forces is given by a difference of angular positions of approximately 120° in each case. A good compromise which takes into consideration both the stability requirements of the apparatus as well as, on the other hand, a maximum freedom of motion for the therapist can be achieved when the difference of the angular position of two neighboring connecting elements 8 is not larger than 140°

Figure 1B:
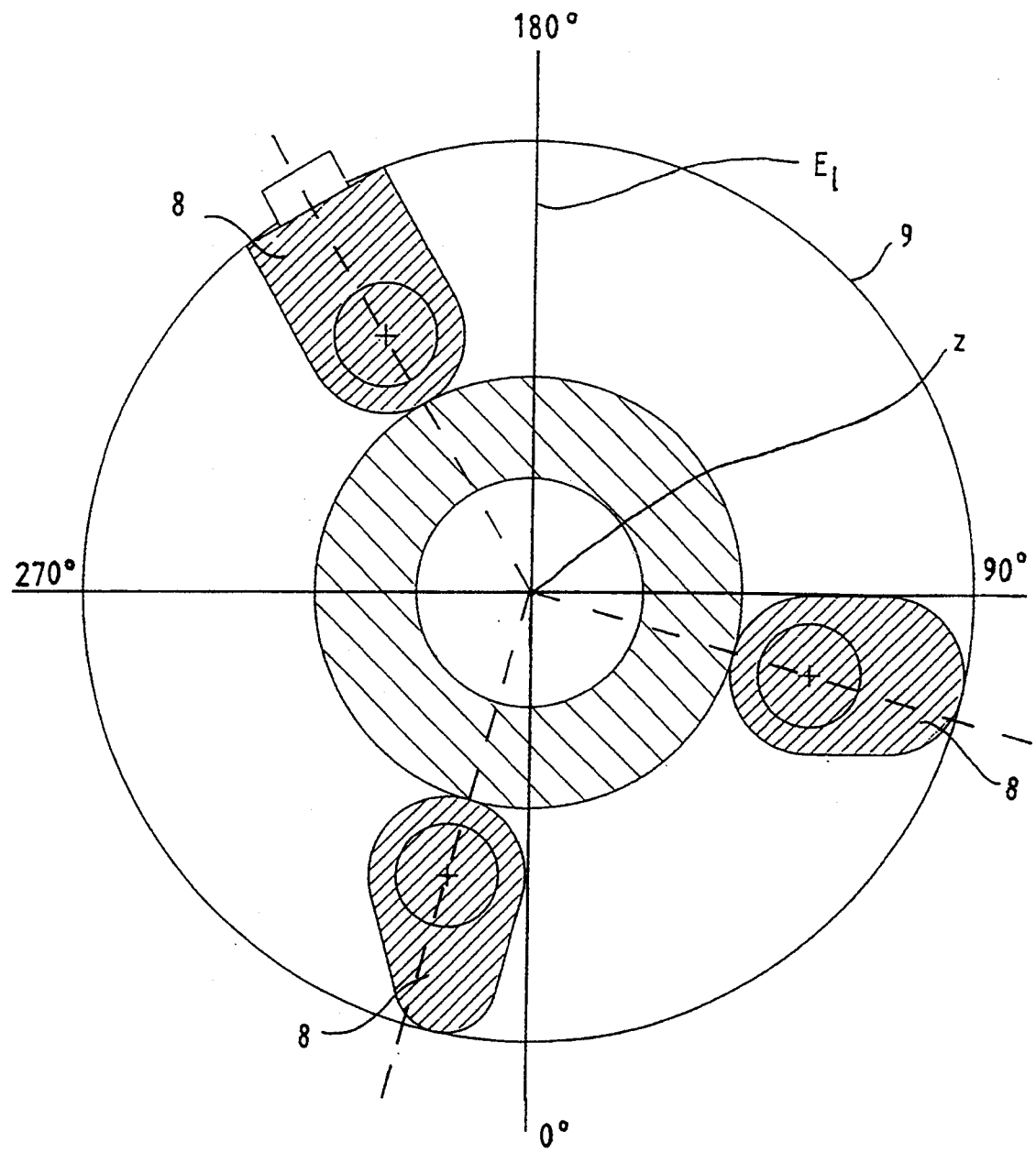
FIG. 1b shows a cut as in FIG. 1a with indication of the relative angular positions with respect to the central axis z.

The embodiment shown in FIG. 1a and 1b clearly indicates that, from the point of view of ergonomics, a distribution of the angular positions of the connecting elements 8 in the angular regions 65° to 85°, 195° to 215° and 335° to 355° is particularly advantageous. This has, for example, the advantage that, in addition to the therapist 3, an assistant 4 can be in close proximity to the patient 2 to assist the therapist 3 with manual operations and the like.

It is unfortunately unavoidable that a connecting element 8 be located at the height of the thigh behind the therapist 3. It is therefore not possible for him to directly enter and leave his work position. However, it is easy to effect an accessable entrance to the working position of the therapist 3 which leads via the connecting element 8 shown in FIG. 1 at an angular position of 85° on to a possibly hydraulic working platform 7 which can be lowered and upon which the therapist 3 stands during his activities and whose height can be adjusted by him according to his individual needs.

Should the therapist, as shown in FIG. 1a stand on a work platform 7 immediately adjacent to the patient 2 at a height which is optimized for the carrying out of manipulations on the patient 2 and which is characterized, for example, by the fact that the therapist 3 can easily reach the patient 2 with his hands positioned with the elbows bent at approximately 90°, the position of the connecting element 8 which is most proximate to his face or the corresponding part of the cryostat is characterized by an angle with respect to the central axis z of approximately 210°. The portion of the cryostat which surrounds the connecting element 8 thereby extends over an angular region of approximately 195° to 225°. Towards this end, it is possible for the therapist 3 to bend without constraint over the patient 2 from the vertical position. An additional connecting element 8 then necessarily lies behind the therapist 3 with its line of center of gravity in an average region of approximately 65° to 85°. The line of center of gravity of the third connecting element 8 lies in an angular region of approximately 335° to 355° so that an additional second person, for example, the assistant 4, can approach the patient 2 in an erect position. It is then possible, in this position, for the assistant 4 to stand erect with his head below the first mentioned connecting element 8 and with his feet directly before the last mentioned connecting element 8 or the corresponding part of the cryostat. A configuration of this type allows, on the one hand, for all the required ergonomic functions and, on the other hand, facilitates a limitation of the maximum angle between the connecting lines from the central axis z to the lines of the centers of gravity of neighboring connecting elements 8 to values of approximately 140° which, as discussed above, guarantees the mechanical stability of the entire configuration.

The length g of the strut-like connecting elements 8 which simultaneously define the length of the transverse gap for access to the room temperature bore 5, assumes a value, in the example shown, of approximately 0.6 times the diameter $d_B$ of the room temperature bore 5. If the partial coil system of the main-field magnet exhibits, for example, an inner diameter of $d_i = 1.4$ m and the transverse gap has a length of 0.88 m, it is possible to realize a cryostat for cooling the magnet with liquid helium which has a room temperature bore 5 with a diameter $d_B = 1.25$ m and a transverse opening with an axial extent of approximately 0.66 m. The gradient coils of such a system can therefore exhibit inner diameters of likewise approximately 0.66 m.

Figure 2:
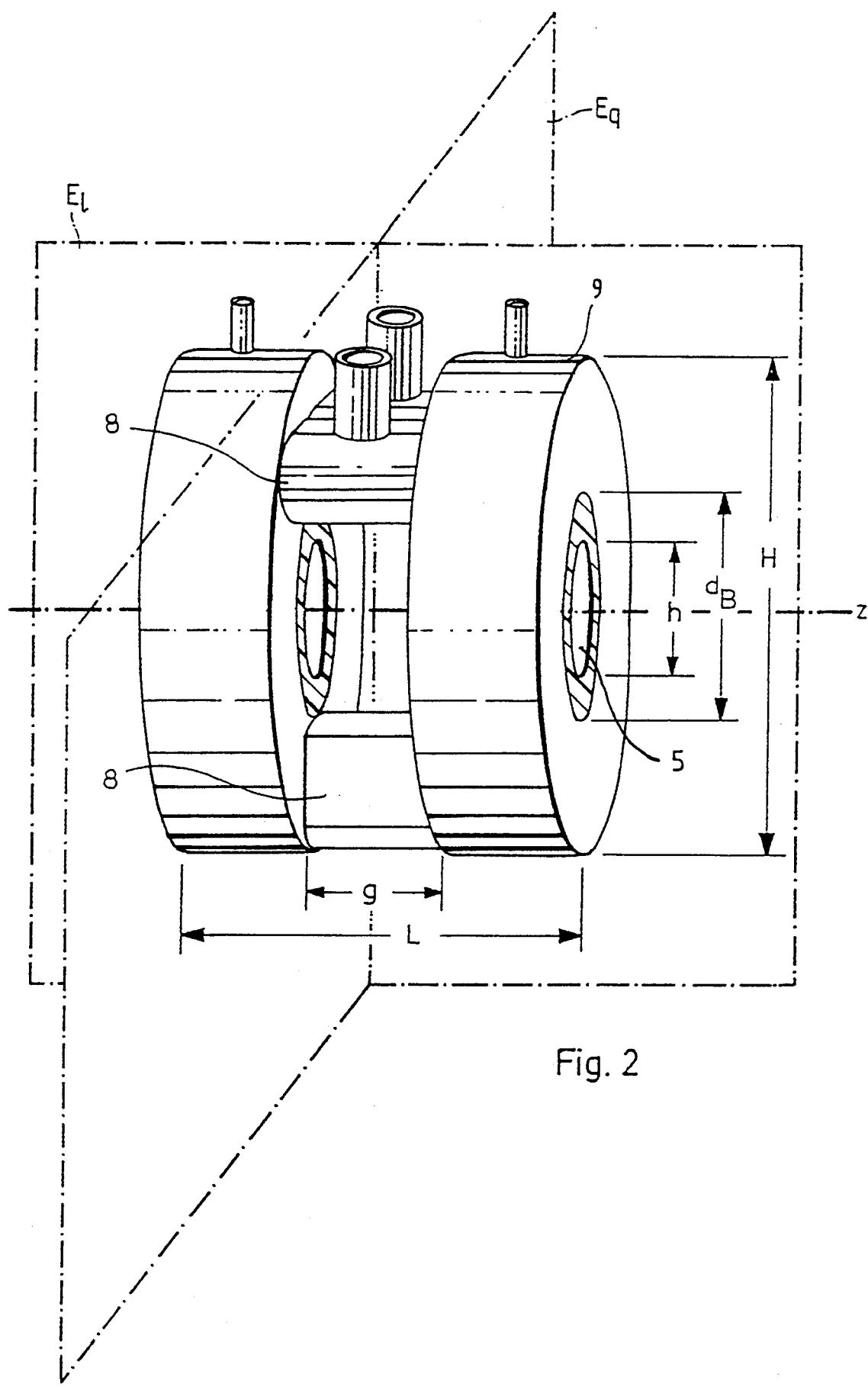
FIG. 2 shows a perspective overall view of an NMR tomography apparatus described in a subsequently published DE 42 30 145 A1 with associated cryostat for a superconducting main-field magnet coil.

The perspective overall view of a inventive NMR tomography apparatus of FIG. 2, having possibilities for sideward access but without having the inventive configuration of the connecting elements 8 shows, among other things the entire hight H of such an apparatus which is determined by the outer diameter of the cryostat, the high h of the horizontal patient bore, the width g of the sideward access gap to the central investigational volume and the length L of the entire apparatus.

Details of the cryosystem likewise shown in FIG. 2 for the superconducting main-field magnet coil will not be gone into here.

Figure 3:
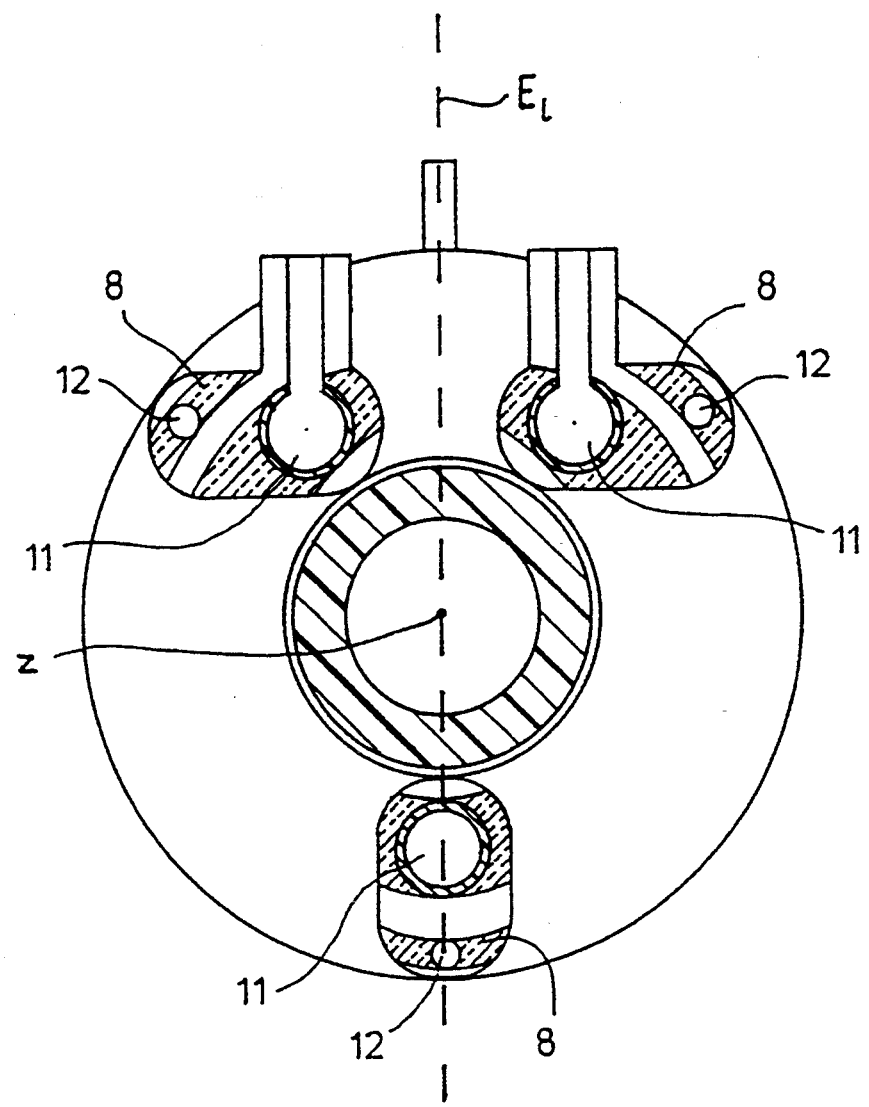
FIG. 3 shows a cut through the sideward engagement gap of the system shown in FIG. 2 with a view of the patient bore of one of the two main-coil halfs.

FIG. 3 shows a cut perpendicular to the central axis z through the sideward access gap of the NMR tomography apparatus according to FIG. 2. Visible through the cut open longitudinal struts 8 are connecting tubes 11 between the two halves of the helium tank of the cryostatic system containing the superconducting magnet coil as well as connecting tubes 12 between the tanks surrounding the helium tank having liquid nitrogen. The conventionally present radiation shields are not sketched.

Figure 4:
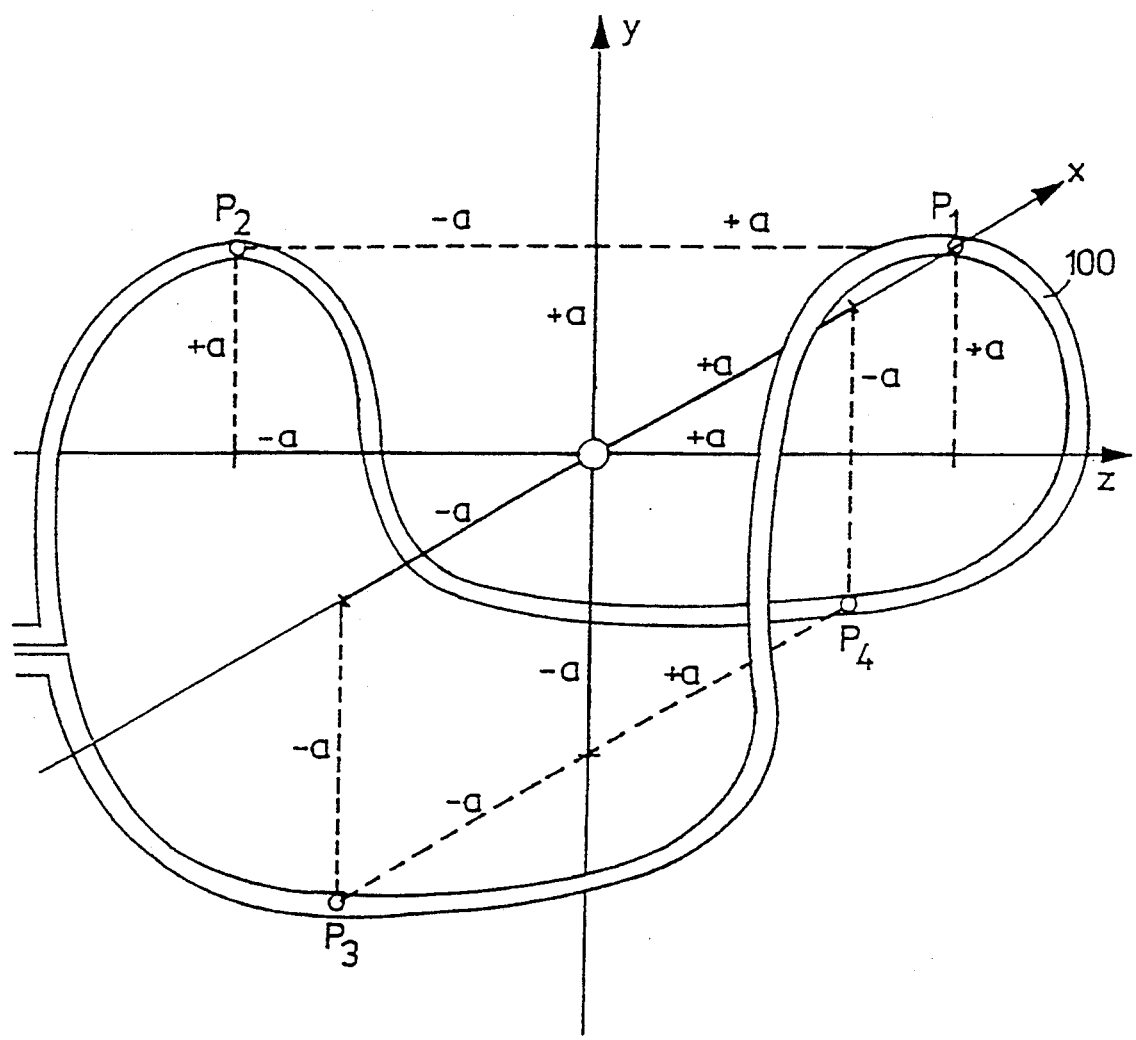
FIG. 4 shows a YIN-YANG coil spanning a cartesian coordinate system with a coordinate origin at the center of the measurement volume.

The YIN-YANG-RF coil 100 shown in FIG. 4, which is preferentially utilized in the inventive NMR system, is closed (with the exception of the current leads), and is arranged in the saddle shape about the z axis of a cartesian coordinate system which is coincident with the central axis of the main-field magnet, and symmetric to the zy plane and to the xy plane, however, asymmetric with respect to the zx plane. After installation into the NMR measuring device it surrounds the measurement volume arranged about the coordinate origin.

The YIN-YANG coil 100 allows, as can be seen from FIG. 4, for a particularly advantageous transverse access to a patient lying longitudinally along the z axis in the homogeneous volume. Since no interfering transverse struts are provided for above the zx plane parallel to the z axis, the YIN-YANG-RF coil exhibits a particularly large transparency.

The four extremum points $P_1$ to $P_4$ of the RF coil preferentially lie approximately at the following coordinates:

| | | | |
|---|---|---|---|
| $P_1$: | $x_1 = 0$ | $y_1 = +a$ | $z_1 = +a$ |
| $P_2$: | $x_2 = 0$ | $y_2 = +a$ | $z_2 = -a$ |
| $P_3$: | $x_3 = -a$ | $y_3 = -a$ | $z_3 = 0$ |
| $P_4$: | $x_4 = +a$ | $y_4 = -a$ | $z_4 = 0$ |

Towards this end the path length a can assume values between 20 cm and 50 cm, preferentially approximately at 30 cm.

Figure 5A:
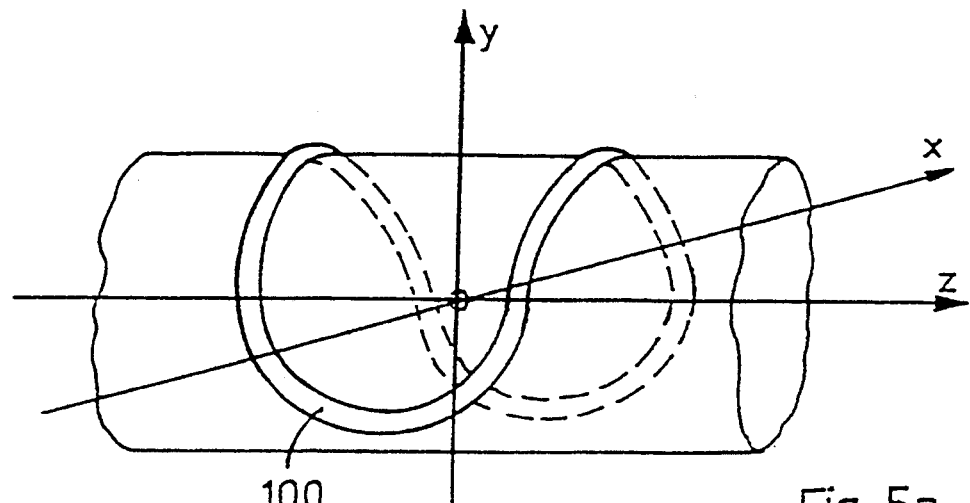
FIG. 5a shows a YIN-YANG coil which largely follows the contours of a cylinder.

The YIN-YANG-RF coil 100 can as shown in FIG. 4, either exhibit squared contours with rounded edges or as shown in FIG. 5a can, however, largely follow the contours of a cylinder about the z axis with radius a. A cylinder of this type corresponds quite closely to the room temperature bore of a NMR cryostat through which the patient is inserted into the NMR tomography apparatus in the direction of the z axis.

Figure 5B:
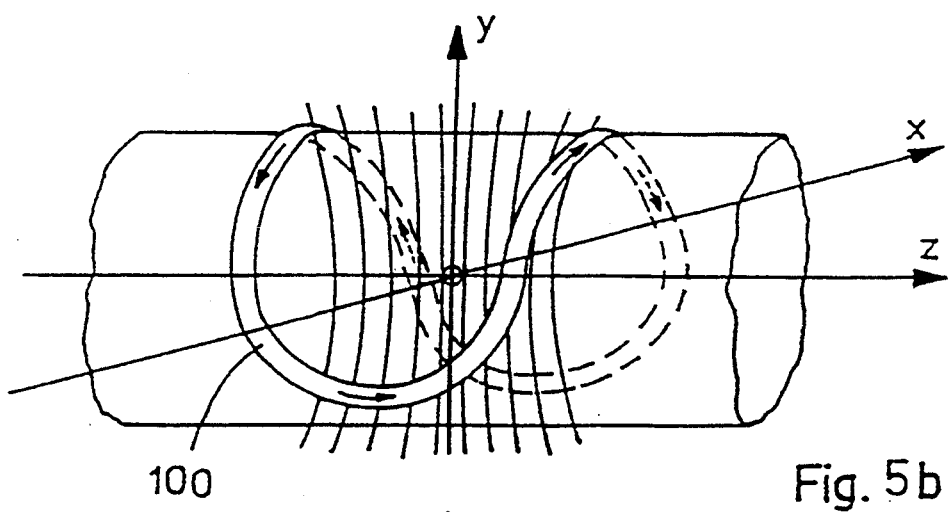
FIG. 5b shows a YIN-YANG coil with indicated RF field lines.

The arrows on the coil 100 in FIG. 5b are intended to indicate a possible current flow direction through the coil. Also indicated in FIG. 5b are the RF field lines produced by the YIN-YANG-RF coil 100 which run in a largely homogeneous fashion in the measurement volume about the coordinate origin.

The YIN-YANG coil 100 can comprise wire, preferentially copper wire, with one or more windings. Another possibility is the utilization of a closed electrically conducting band, preferentially made from copper sheet metal, for the construction of the YIN-YANG-RF coil 100 in the manner of the so-called "stream-line coil".

Figure 6:
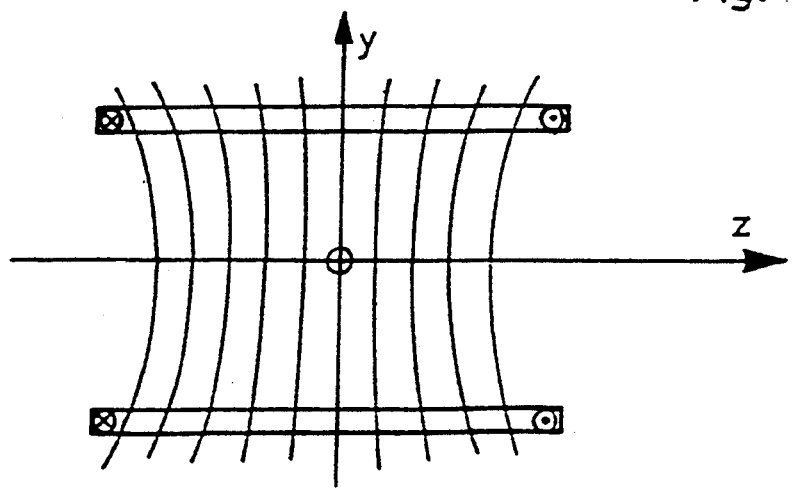
FIG. 6 shows a longitudinal cut through a Helmholtz-like RF transmitting coil according to prior art.

FIG. 6 shows, for comparison purposes, a Helmholtz-like RF coil according to prior art comprising two partial coils above and below the zx plane symmetric to the coordinate origin. In addition, the RF field-line dependences produced by these known coils are indicated. As one clearly sees a transverse access using this known configuration is possible, however, the upper partial coils in any event hinder the access of an operator from diagonally above.

Figure 7A:
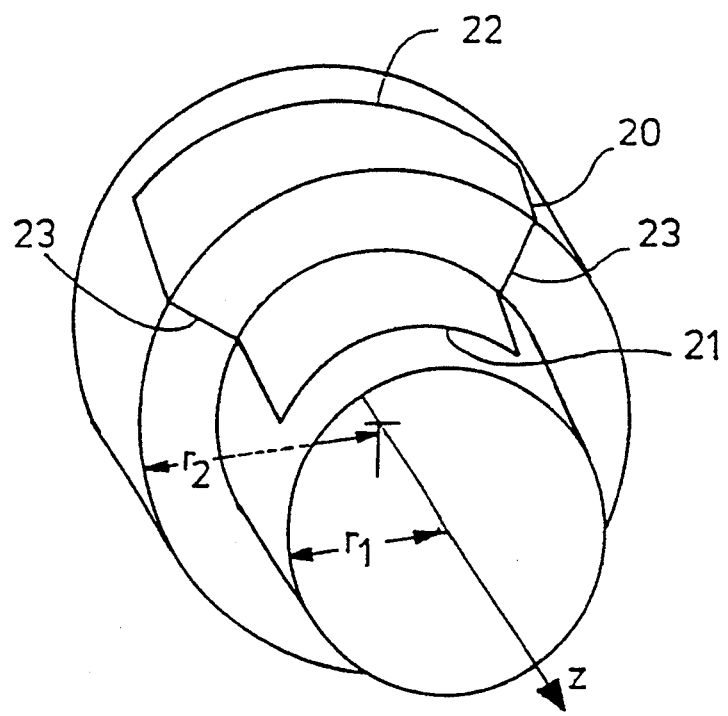
FIG. 7a shows a perspective view of inventive "cropped" saddle coils as partial coils of a gradient coil system with wire windings.
Figure 7B:
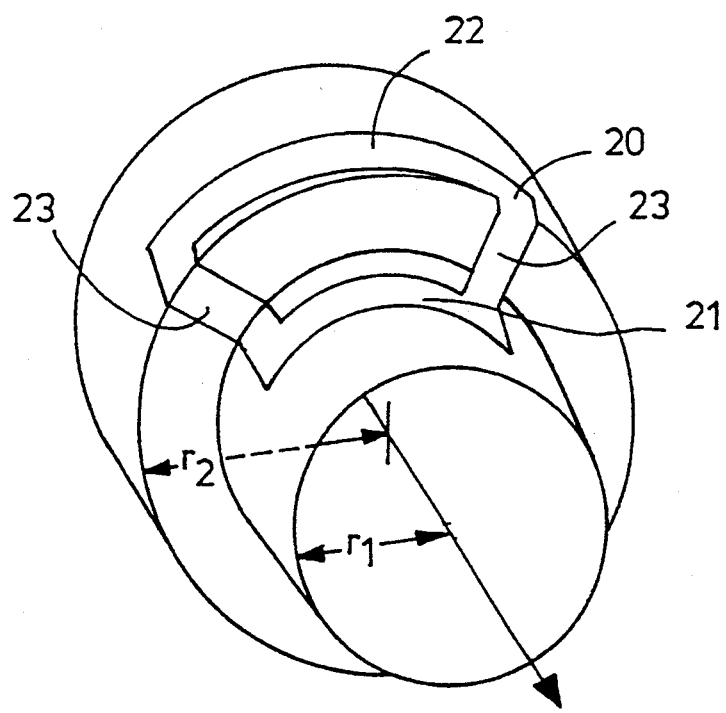
FIG. 7b shows a perspective view of inventive "cropped" saddle coils as partial coils of a gradient coil system with band-shaped construction.

The partial coils 20 of the tesseral gradient system are saddle-like coils as can be seen in FIGS. 7a and 7b. The individual partial coils 20 each exhibit two electrically conducting segments 21, 22 which run in the azimuthal direction about the z axis of which the radially inner segment 21 exhibits a separation $r_1$ and the radially outer segment 22 a separation $r_2$ from the z axis. Both segments 21, 22 are axially separated relative to the z axis, whereby the radially outer segment 22 is arranged closer to the coordinate origin than the radially inner segment 21. Both segments 21, 22 are connected to each other by means of conductor sections 23.

The partial coils 20, as shown in FIG. 7a, can be constructed from wire, preferentially copper wire, or as shown in FIG. 7b, can be made from electrically conducting bands. A further possibility is to build the partial coils 20 as stream-line coils.

In the embodiments shown in FIGS. 7a and 7b the segments 21, 22 of the partial coils 20 lie on surfaces of cylinders about the z axis. In embodiments which are not shown the segments can, however, also lie on conic surfaces which open-up towards the coordinate origin.

In order to compensate for the angular momentum caused by the passage of current through the partial coil 20, it is possible to provide for compensation coils which are largely similar in their construction to the partial coils 20. In particular, the compensation coils can also exhibit azimuthally inner segments and azimuthally outer segments having a larger radial separation from the z axis than the inner segments.

The inventive NMR tomography system which is described above facilitates, due to the free sideward access to the investigational volume, completely new work possibilities for physicians in the diagnostic and surgical areas.

We claim:

1. In an improved nuclear magnetic resonance (NMR) tomography apparatus comprising a superconducting main-field magnet having a center at a coordinate origin of a cartesian coordinate system having an x, y and a z axis and an xy, xz and a yz plane, the main-field magnet having two partial main-magnet coil systems which are mirror-symmetric with respect to the vertical transverse middle xy plane, arranged about the z axis in a rotationally symmetric fashions and adapted to produce a homogeneous static magnetic field; a system of gradient coils; and a two-part cryostat within which the partial coil systems are accommodated, the cryostat being symmetric with respect to the xy plane and having two slice-like partial cryostats which are connected to each other by a plurality of strut-like connecting elements of length g running largely parallel to the z axis, the cryostat exhibiting a room temperature bore diameter $d_B$ running parallel to the z axis, the improvement wherein exactly three strut-like connecting elements are arranged asymmetrically with respect to a vertical longitudinal yz plane and the connecting elements assume angular positions about the origin calculated in a counter-clockwise sense with respect to a vertically downward directed-y axis in the ranges of 50° to 100°, 180° to 230° and 320° to 10°, and a difference between the angular positions of two connecting elements is not larger than 180°.

2. The NMR tomography apparatus according to claim 1, wherein the difference between angular positions of two neighboring points of intersection of the lines of centers of gravity is not larger than 140°.

3. The NMR tomography apparatus according to claim 1, wherein the difference between the angular positions of two neighboring points of intersection of the lines of centers of gravity assumes a value, in each case, of approximately 120°.

4. The NMR tomography apparatus according to claim 1, wherein the angular positions of the points of intersection of the lines of centers of gravity assume values in the ranges 65° to 85°, 195° to 215° and 335° to 355°.

5. The NMR tomography apparatus according to claim 1, further comprising a gap between the partial cryostats, having a length g, wherein $1.6\ g \leq d_B \leq 2.1\ g$.

6. The NMR tomography apparatus of claim 1, wherein the system of gradient coils comprises a first set of four largely equal saddle-like gradient partial coils arranged symmetrically at radial and axial separations about the coordinate origin, each gradient partial coil having a plurality of windings and a first and a second electrically conducting gradient coil segment running in an azimuthal direction about the z axis with the first segment having as small a radial separation $r_1$ and the second segment as large a radial separation $r_2$ from the z axis as possible, and both segments exhibiting an axial separation from each other in the direction of the z axis, the second segment being arranged axially, in the z direction, closer ted the coordinate origin than the first segment, and further comprising conductor sections connected between both segments, both segments being commonly located on one of a rotationally symmetric and an ellipsoidal surface.

7. The NMR tomography apparatus of claim 6, wherein two gradient partial coils lie across from each other in a mirror-symmetric fashion with respect to the xy plane at an axial separation $g_g$ from each other in the z direction which is approximately equal to length g.

8. The NMR tomography apparatus of claim 6, wherein $2.r_2$ is slightly smaller than $d_B$.

9. The NMR tomography apparatus of claim 6, wherein $2.r_1$ is only slightly larger than a diameter of a hypothetical cylinder which offers sufficient space to a patient in the NMR tomography apparatus during the course of an examination.

10. The NMR tomography apparatus of claim 6, further comprising, for each gradient partial coil, a compensation coil which exhibits, in an axial vicinity of the first gradient coil segment, an azimuthally inner first compensation coil segment with a radial separation $r_1'$ from the z axis which differs from the radial separation $r_1$ of the first gradient coil segment by approximately radial thickness of the segment.

11. The NMR tomography apparatus according to claim 10, wherein the compensation coil exhibits a second azimuthal compensation coil segment having a larger axial separation in the z direction from the coordinate origin than the first compensation coil segment and which has a radial separation $r_2' > r_1'$ from the z axis.

12. The NMR tomography apparatus according to claim 6, further comprising two shielding coils each of which is arranged about two gradient partial coils which lie radially opposite each other with respect to the z axis, the shielding coils being located on surface of a cylinder about the z axis of radius $R_2 r_2$, the cylinder having a length in the z direction which approximately corresponds to an axial length of the main-field magnet.

13. The NMR tomography apparatus of claim 6, further comprising a second set of four gradient partial coils displaced with respect to the first set of coils by 90° about the z axis.

14. The NMR tomography apparatus of claim 6, further comprising a shielded z gradient coil system which is adapted to produce magnetic gradient fields in the measurement volume having a largely linear dependence in a direction parallel to the z axis, the z gradient system comprising two cylindrical coil pairs which are arranged about the z axis mirror-symmetrically with respect to the xy plane and each pair having a radially inner z gradient field coil and a radially outer shielding coil, the cylindrical coil pairs being arranged in an axial region of the first gradient coil segment, and a radial separation $r_4$ of the shielding coil winding is less than $r_2$.

15. The NMR tomography apparatus of claim 14, wherein the z gradient field coil has a number of windings which is approximately $(r_4/r_3)^2$ times a number of windings of the shielding coil, with $r_3$ being a radial separation of the z gradient field coil from the z axis.

16. The NMR tomography apparatus according to claim 6, wherein the gradient partial coils are potted within a suitable material within a support body so that an axial bore about the z axis remains open which is suitable to accept a person and a radial frequency (RF) coil system, the RF coil system being one of axially insertable into the axial bore of the support body and transversely insertable into the gap g and being adapted for the production of a largely homogeneous RF field in a measurement volume in the direction of one of the x and the y axis, the RF coil system comprising a saddle-shaped closed RF coil (100) which is arranged about the z axis symmetric to the zy plane and to the xy plane, however, asymmetric to the zx plane.

17. The NMR tomography apparatus of claim 16, wherein the RF coil (100) comprises four field extremal points P1 to P4 in the direction of the y axis with approximately the coordinates

| | | | |
|---|---|---|---|
| $P_1$: | $X_1 = 0$ | $Y_1 = +a$ | $Z_1 = +a$ |
| $P_2$: | $X_2 = 0$ | $Y_2 = +a$ | $Z_2 = -a$ |
| $P_3$ | $X_3 = -a$ | $Y_3 = -a$ | $Z_3 = 0$ |
| $P_4$ | $X_4 = +a$ | $Y_4 = -a$ | $Z_4 = 0$ |

* * * * *